(12) United States Patent
Markle et al.

(10) Patent No.: US 6,790,376 B1
(45) Date of Patent: Sep. 14, 2004

(54) PROCESS CONTROL BASED UPON WEIGHT OR MASS MEASUREMENTS, AND SYSTEMS FOR ACCOMPLISHING SAME

(75) Inventors: Richard J. Markle, Austin, TX (US); Robert J. Chong, Austin, TX (US)

(73) Assignee: Advanced Micro Devices, Inc., Austin, TX (US)

( * ) Notice: Subject to any disclaimer, the term of this patent is extended or adjusted under 35 U.S.C. 154(b) by 372 days.

(21) Appl. No.: 09/911,264

(22) Filed: Jul. 23, 2001

(51) Int. Cl.[7] .............................................. C03C 15/00
(52) U.S. Cl. .......................... 216/84; 216/59; 216/79; 438/706
(58) Field of Search ............................ 216/58, 59, 79, 216/84; 438/706, 710, 714

(56) References Cited

U.S. PATENT DOCUMENTS

| | | | | |
|---|---|---|---|---|
| 5,625,170 A | * | 4/1997 | Poris ........................... | 177/50 |
| 6,050,138 A | * | 4/2000 | Lynch et al. .............. | 73/150 A |
| 6,284,986 B1 | * | 9/2001 | Dietze et al. .................. | 177/50 |

OTHER PUBLICATIONS

Christel et al., "Single–Crystal Silicon Pressure Sensors with 500 × Overpressure Protection," *Sensors and Actuators,* A21–A23:84–88, 1990.
Guckel, "Surface Micromachined Pressure Transducers," *Sensors and Actuators,* A28:133–46, 1991.
Ko et al., "A High Sensitivity Integrated–Circuit Capacitive Pressure Transducer," *IEEE Transactions on Electron Device,* ED–29:48–56. 1982.
Lee and Wise, "A Batch–Fabricated Silicon Capacitive Pressure Transducer with Low Temperature Sensitivity," *IEEE Transactions on Electron Devices,* ED–29:42–48, 1982.
Mallon et al., "Low–Pressure Sensors Employing Bossed Diaphragms and Precision Etch–Stopping," *Sensors and Actuators,* A21–A23:89–95, 1990.
Sander et al., "A Monolithic Capacitive Pressure Sensor with Pulse–Period Output," *IEEE Transactions on Electron Devices,* ED–27:927–30, 1980.

* cited by examiner

*Primary Examiner*—Lan Vinh
(74) *Attorney, Agent, or Firm*—Williams, Morgan & Amerson, P.C.

(57) ABSTRACT

In general, the present invention is directed to methods of using weight or mass measurements to control various semiconductor manufacturing processes, and systems for accomplishing same. One illustrative method comprises providing a substrate, performing a deposition process to form a process layer above the substrate, determining a weight or mass of the process layer formed above the substrate, and controlling at least one parameter of the deposition process based upon the determined weight or mass of the process layer. One illustrative system in accordance with the present invention comprises a deposition tool for performing a deposition process to form a process layer above a substrate, a pressure sensor in contact with the substrate for sensing a pressure induced as a result of the process layer formed above the substrate, and a controller for controlling at least one parameter of the deposition process based upon the sensed pressure. The method and systems disclosed herein may also be used with other processes, such as etching processes.

95 Claims, 2 Drawing Sheets

PROCESS CONTROL BASED UPON WEIGHT OR MASS MEASUREMENTS, AND SYSTEMS FOR ACCOMPLISHING SAME

BACKGROUND OF THE INVENTION

1. Field of the Invention

This invention relates generally to semiconductor fabrication technology, and, more particularly, to a method of using weight or mass measurements to control various semiconductor manufacturing processes, and systems for accomplishing same.

2. Description of the Related Art

There is a constant drive within the semiconductor industry to increase the operating speed of integrated circuit devices, e.g, microprocessors, memory devices, and the like. This drive is fueled by consumer demands for computers and electronic devices that operate at increasingly greater speeds. This demand for increased speed has resulted in a continual reduction in the size of semiconductor devices, e.g., transistors. That is, many components of a typical field effect transistor (FET), e.g., channel length, junction depths, gate insulation thickness, and the like, are reduced. For example, all other things being equal, the smaller the channel length of the transistor, the faster the transistor will operate. Thus, there is a constant drive to reduce the size, or scale, of the components of a typical transistor to increase the overall speed of the transistor, as well as integrated circuit devices incorporating such transistors.

In the process of forming integrated circuit devices, millions of transistors are formed above a semiconducting substrate. In general, semiconductor manufacturing operations involve, among other things, the formation of layers of various materials, e.g., polysilicon, insulating materials, etc., and the selective removal of portions of those layers by performing known photolithographic and etching techniques. These processes are continued until such time as the integrated circuit device is complete. Additionally, a typical integrated circuit device is comprised of a plurality of conductive interconnections, such as conductive lines and conductive contacts or vias, positioned in multiple layers of insulating material formed above the substrate. These conductive interconnections allow electrical signals to propagate between the transistors formed above the substrate.

A variety of processes may be used to form the process layers above the substrate. For example, a process layer may be formed by chemical vapor deposition (CVD), plasma enhanced chemical vapor deposition (PECVD), physical vapor deposition (PVD), thermal growing, etc. Moreover, the process layers may be comprised of a variety of materials, e.g., a metal, polysilicon, silicon dioxide or other various types of insulating material having a dielectric constant less than 5.0, etc. The thickness of the resulting process layer is, typically, very important. If the thickness of the layer falls outside of a relatively tightly controlled acceptable range, then one or more subsequent processes and/or the performance of the completed integrated circuit device may be adversely impacted or compromised.

In an effort to control the deposited thickness of a process layer, most modern semiconductor manufacturing facilities perform a deposition process (or thermal growth process if appropriate) for a fixed duration of time. During this process, it is assumed, based upon empirical evidence of the deposition rate of the given process, that a process layer of a given thickness has been formed. However, these assumed deposition rates vary depending upon a variety of factors, such as the cleanliness of the deposition tool, the quality of the gas supplied to the process, the precise power settings used, etc. Moreover, these variations may extend across one or more deposition tools that are intended to be used to form similar process layers on different substrates. As a result, it is difficult to control the as-formed thickness of the process layer based upon the duration of the deposition process. Direct measurement of the thickness of the process layer after or as it is being formed is also problematic given the nature of the metrology tools involved. For example, in using optical metrology, there may be interfering lights, inspection windows may fog, etc. Moreover, dielectric layers tend to excessively refract light used during such optical metrology.

Additionally, another problem that is encountered in semiconductor manufacturing involves determining when to stop an etching process. Ideally, an etching process should be stopped at the precise point where all of the desired material has been removed, and no damage has occurred to the underlying structure. Current etching processes may be performed for a fixed duration (a timed etch process) or they may be endpointed using a variety of techniques, e.g., an analysis of gases emitted during the process and/or an optical metrology tool that detects when the underlying layer is visible, at least in the section where the optical metrology tool is focused. However, these endpoint techniques may prove inadequate in certain situations. Moreover, as with the deposition processes described above, the etch rate of various processes may vary depending upon the cleanliness of the etch tool, the quality of the gases used, etc.

In some situations a sensor, such as an acoustic wave sensor, has been mounted on the wall of a deposition chamber to determine the extent of material build-up on the wall of the chamber, i.e., the cleanliness of the chamber. For example, see the presentation entitled "Wall Deposition and Cleaning Studies in Polysilicon Plasma Etch Chambers Using a Quartz Crystal Microbalance," dated May 1995, that is submitted herewith in an appropriate information disclosure form. Using input from the sensor, a decision may then be made as to when cleaning of the chamber is required. Prior to the use of such sensor information, deposition chambers were cleaned on an established schedule, i.e., after a given number of wafers had been processed. However, using such a cleaning protocol resulted in performing time-consuming cleaning operations when it may have been unnecessary. As a result, manufacturing efficiencies may have been reduced.

The present invention is directed to a method and system that may solve, or at least reduce, some or all of the aforementioned problems.

SUMMARY OF THE INVENTION

In general, the present invention is directed to methods of using weight or mass measurements to control various semiconductor manufacturing processes, and systems for accomplishing same. One illustrative method comprises providing a substrate, performing a deposition process to form a process layer above the substrate, determining a weight or mass of the process layer formed above the substrate, and controlling at least one parameter of the deposition process based upon the determined weight or mass of the process layer.

Another illustrative method comprises providing a substrate having a process layer formed thereabove, performing an etching process to remove at least a portion of the process layer, determining a weight or mass of the removed portion of the process layer, and controlling at least one parameter of the etching process based upon the determined weight or mass of the removed portion of the process layer.

One illustrative system in accordance with the present invention comprises a deposition tool for performing a deposition process to form a process layer above a substrate, a pressure sensor in contact with the substrate for sensing a pressure induced as a result of the process layer formed above the substrate, and a controller for controlling at least one parameter of the deposition process based upon the sensed pressure. In other illustrative embodiments, a scale or balance may be used to measure the weight or mass, respectively, of the material added during the deposition process.

Another illustrative system in accordance with the present invention comprises an etch tool for performing an etching process to remove at least a portion of a process layer formed above a substrate, a pressure sensor in contact with the substrate for sensing a change in pressure resulting from the removal of at least a portion of the process layer, and a controller for controlling at least one parameter of the etching process based upon the sensed pressure. In another illustrative embodiment, a scale or balance may be used to measure the weight or mass, respectively, of the material removed during the etching process.

BRIEF DESCRIPTION OF THE DRAWINGS

The invention may be understood by reference to the following description taken in conjunction with the accompanying drawings, in which like reference numerals identify like elements, and in which.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF THE INVENTION

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present invention will now be described with reference to the attached figures. The various tools and components are schematically depicted in the drawings, however, those skilled in the art recognize that, in reality, these tools and components may contain additional supporting devices, structures and components, e.g., motors, power supplies, robotic arms, etc., that are not depicted in the drawings. Nevertheless, the attached drawings are included to describe and explain illustrative examples of the present invention.

In general, the present invention is directed to methods of using weight or mass measurements to control various semiconductor manufacturing processes, and systems for accomplishing same. As will be readily apparent to those skilled in the art upon a complete reading of the present application, the present method is applicable to a variety of technologies, e.g., NMOS, PMOS, CMOS, etc., and it is readily applicable to a variety of devices, including, but not limited to, logic devices, memory devices, etc.

Semiconductor manufacturing generally involves multiple processes whereby multiple layers of material are formed above a semiconducting substrate, and portions of those layers are selectively removed until such time as a completed device is formed. In general, photolithography involves the process of forming a layer of photoresist material above one or more process layers in which a feature, e.g., a metal line, a gate electrode, an opening in a layer of insulating material, will be formed. Thereafter, a pattern that is desired to be transferred into the underlying process layer or layers will be formed in the layer of photoresist material. Then, using one or more etching processes, the underlying process layer is etched using the patterned layer of photoresist as a mask, thereby resulting in a patterned process layer that replicates the pattern formed in the layer of photoresist. The present invention is directed to various methodologies that may be useful in performing such processes.

Figure 1:
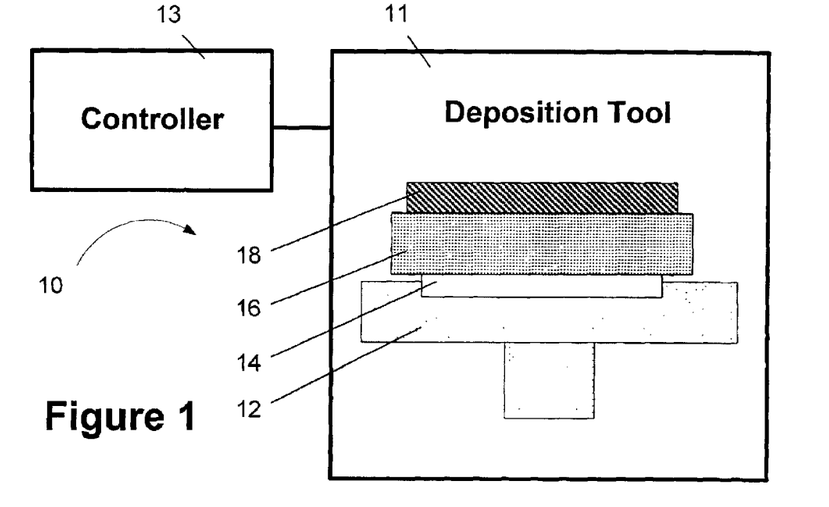
FIG. 1 is a schematic view of an illustrative deposition system in accordance with one embodiment of the present invention.

As will be recognized by those skilled in the art after a complete reading of the present application, the present invention may be employed in a variety of processes commonly encountered in semiconductor manufacturing operations, e.g., deposition and etching processes. FIG. 1 depicts one illustrative embodiment of a deposition system 10 that may be used with the present invention. As shown therein, the system 10 is comprised of a deposition tool 11, and a controller 13. The deposition tool 11 is further comprised of a wafer stage 12, metrology instrumentation 14, and a substrate 16 having a process layer 18 formed thereabove. As stated previously, the drawings included in the present application are intended to be schematic in nature, i.e., they do not depict all features of a working deposition tool, as those details have been omitted for purposes of clarity.

The deposition tool 11 depicted in FIG. 1 may be any type of tool useful for forming the process layer 18. Moreover, the present invention may be used in forming a process layer 18 comprised of a variety of materials, e.g., a metal such as copper, tantalum, cobalt, aluminum, a layer of material having a dielectric constant less than 5.0, such as silicon dioxide, or a layer of polysilicon. The process layer 18 may be formed directly on the substrate 16 or above the substrate 16 on a previously formed layer of material (not shown). The present invention may be used with a variety of processes, e.g., chemical vapor deposition (CVD), plasma enhanced chemical vapor deposition (PECVD), physical vapor deposition (PVD), thermal growth processes, etc. Thus, for example, the process layer 18 may be comprised of a layer of aluminum deposited by a PVD process. In another embodiment, the process layer 18 may be a layer of silicon dioxide formed by a CVD process. The present invention may be used in forming the process layer 18 to a variety of thicknesses. Thus, the present invention should not be considered as limited to a particular deposition process or a particular type of material used to form the process layer 18 unless such limitations are clearly set forth in the appended claims.

In one embodiment, the wafer stage 12 is used to support the substrate 16 during the period when the process layer 18 is being formed. Although not depicted in the drawings, the wafer stage 12 may contain one or more means for securing the substrate 16 to the wafer stage 12 during processing operations. For example, the wafer stage 12 may be equipped with a vacuum chuck (not shown) or clamps (not shown) for holding the substrate 16 during processing operations.

The metrology instrumentation 14 will be used in determining, directly or indirectly, the weight or mass of the material comprising the process layer 18 at one or more times before or during the process used to form the process layer 18, or after the formation process is believed to have been successfully completed. The sensed information obtained by the metrology instrumentation 14 may be provided to the controller 13 and used in controlling one or more aspects of the formation process, e.g., a PVD process, as described more fully below.

The metrology instrumentation 14 may be any of a variety of different types of metrology tools. The data obtained by the metrology instrumentation 14 is representative, directly or indirectly, of the weight or mass of material deposited during the deposition process. For example, the metrology instrumentation 14 may be comprised of one or more pressure sensors or it may be comprised of a scale that provides a digital output based upon the amount of weight positioned on the metrology instrumentation 14. Other types of sensors may also be employed, e.g., a scale, a balance, other mechanical sensors, capacitive sensors, field effect sensors, and piezoelectric sensors supplied by vendors such as AMP, MSI and 3M.

The metrology instrumentation 14 may have a variety of physical configurations, and it may be mounted within the deposition tool 11 in a variety of ways. For example, in the situation where the metrology instrumentation 14 is a pressure sensor, it may be configured as a generally cylindrical member that is positioned so as to contact, either directly or through one or more intermediate members, the substrate 16. Through this direct or indirect contact, the pressure sensor will be able to sense the additional pressure resulting from the addition of material comprising the process layer 18 as it is formed above the substrate 16. Alternatively, the metrology instrumentation 14 may be a pressure sensor configured, in part, as a plurality of upstanding fingers (not shown) that contact, directly or indirectly, the substrate 16. In situations where the metrology instrumentation 14 is a scale or balance, it may also have a variety of configurations, e.g., a generally flat scale or a plurality of pins that contact, directly or indirectly, the substrate 16.

Figure 2:
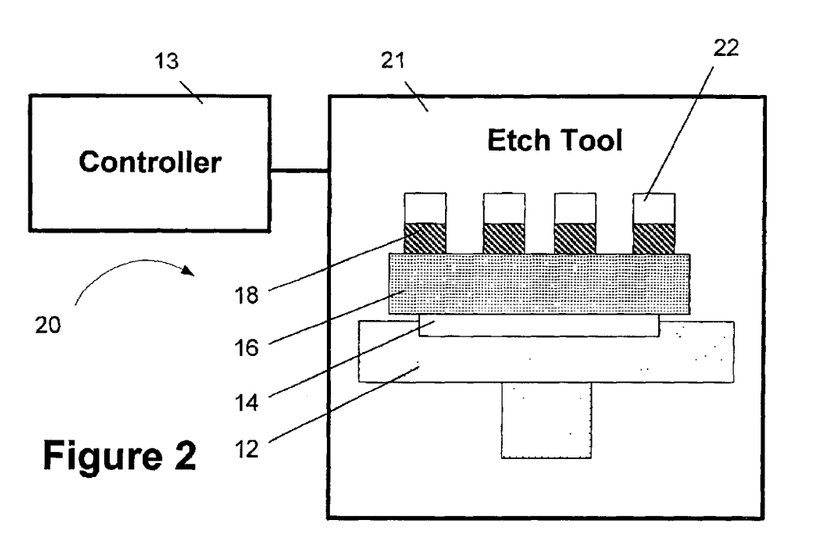
FIG. 2 is a schematic view of an illustrative etching system in accordance with one embodiment of the present invention.

In the illustrated embodiments, the controller 13 is a computer programmed with software to implement the functions described herein. Moreover, the functions described for the controller 13 may be performed by one or more controllers spread through the system. For example, the controller 13 may be a fab level controller that is used to control processing operations throughout all or a portion of a semiconductor manufacturing facility. Alternatively, the controller 13 may be a lower level computer that controls only portions or cells of the manufacturing facility. Moreover, the controller 13 may be a stand-alone device, or it may reside on the deposition tool 11 or etch tool 21 (to be discussed later). However, as will be appreciated by those of ordinary skill in the art, a hardware controller (not shown) designed to implement the particular functions may also be used.

Portions of the invention and corresponding detailed description are presented in terms of software, or algorithms and symbolic representations of operations on data bits within a computer memory. These descriptions and representations are the ones by which those of ordinary skill in the art effectively convey the substance of their work to others of ordinary skill in the art. An algorithm, as the term is used here, and as it is used generally, is conceived to be a self-consistent sequence of steps leading to a desired result. The steps are those requiring physical manipulations of physical quantities. Usually, though not necessarily, these quantities take the form of optical, electrical, or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be understood, however, that all of these and similar terms are to be associated with the appropriate physical quantities and are merely convenient labels applied to these quantities. Unless specifically stated otherwise, or as is apparent from the discussion, terms such as "processing" or "computing" or "calculating" or "determining" or "displaying" or the like, refer to the actions and processes of a computer system, or similar electronic computing device, that manipulates and transforms data represented as physical, electronic quantities within the computer system's registers and memories into other data similarly represented as physical quantities within the computer system memories or registers or other such information storage, transmission or display devices.

An exemplary software system capable of being adapted to perform the functions of the controller 13, as described, is the Catalyst system offered by KLA Tencor, Inc. The Catalyst system uses Semiconductor Equipment and Materials International (SEMI) Computer Integrated Manufacturing (CIM) Framework compliant system technologies, and is based on the Advanced Process Control (APC) Framework. CIM (SEMI E81-0699—Provisional Specification for CIM Framework Domain Architecture) and APC (SEMI E93-0999—Provisional Specification for CIM Framework Advanced Process Control Component) specifications are publicly available from SEMI.

FIG. 2 schematically depicts an alternative, illustrative system 20 comprising an etch tool 21 and the controller 13 that may be used with the present invention. The system 20 is also comprised of the wafer stage 12 and metrology instrumentation 14. As will be described in more detail later, the present invention may be used in the context of reducing the thickness of the process layer 18 or in patterning the process layer 18. In the illustrative situation depicted in FIG. 2, the etch tool 21 is used to pattern the process layer 18 using a patterned layer of photoresist 22 as a mask. The patterned layer of photoresist 22 may be formed using a variety of known photolithography processes.

Figure 3:
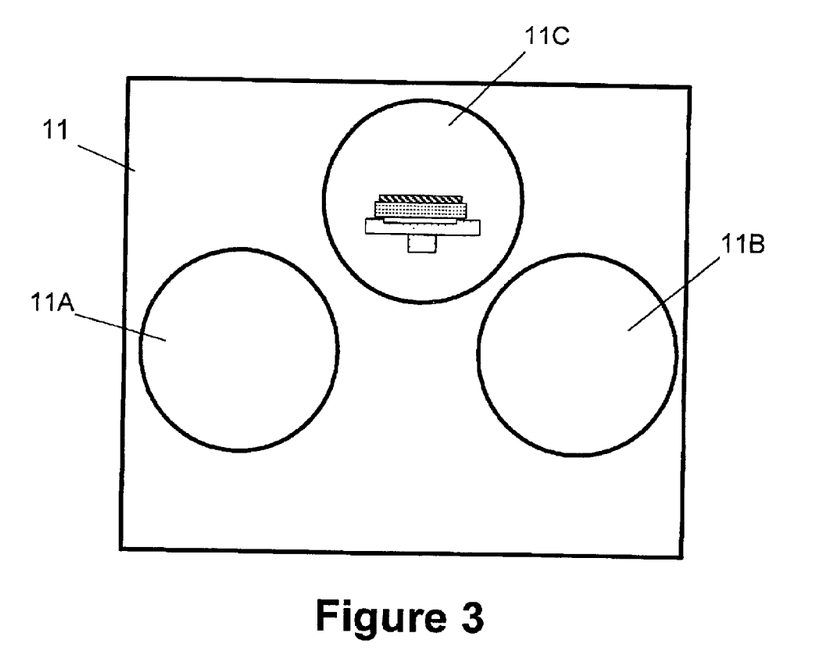
FIG. 3 is a schematic view of an illustrative configuration of a deposition tool in accordance with one embodiment of the present invention.

From a system perspective, the metrology instrumentation 14 of the present invention may be deployed in a variety of ways. For example, the metrology instrumentation 14 may be employed in an in situ manner, i.e., within a deposition or etch chamber of the appropriate tool. Alternatively, as shown in FIG. 3, the process tool, e.g., deposition tool 11, may have a separate metrology chamber 11C and a plurality of process chambers 11A, 11B. The metrology instrumentation 14 may be positioned within the metrology chamber 11C. In this configuration, the deposition or etch process may be performed in one or more of the process chambers 11A, 11B. Before or after the process is complete, the substrate 16 may be positioned in the metrology chamber 11C where metrology readings are taken using the metrology instrumentation 14. Thereafter, the substrate 16 may be removed from the process tool 11 or it may be returned to one or more of the process chambers 11A, 11B for further processing, e.g., additional deposition of the process layer 18 or additional etching of the process layer 18.

Figure 4:
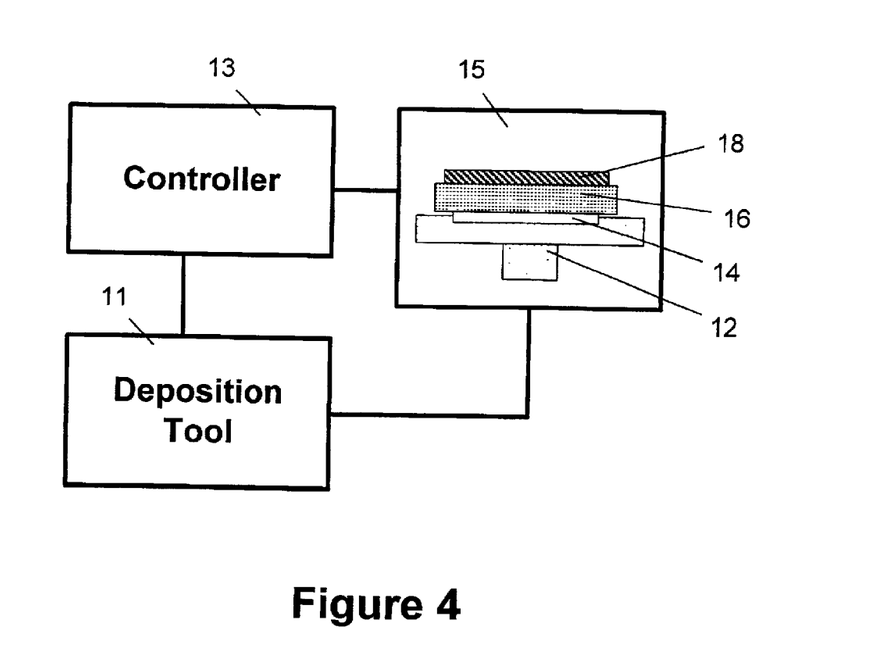
FIG. 4 depicts an alternative configuration of a deposition tool in accordance with one illustrative embodiment of the present invention.

In yet another alternative embodiment, as schematically depicted in FIG. 4, the metrology instrumentation 14 may be located in a stand-alone metrology tool 15 that is separate from the process tool, e.g., deposition tool 11. In this embodiment, substrates processed in the deposition tool 11 may be transported to the metrology tool 15 after the deposition process is performed in the deposition tool 11 for measurement of the process layer 18. Thereafter, the substrate 16 may be returned to the deposition tool 11 for further processing if needed or desired. Of course, as will be recognized by those skilled in the art after a complete reading of the present application, the deposition tool referenced in the above discussion about the various configurations of the metrology instrumentation 14 also readily applies to systems employing an etching tool 21 as the process tool.

Various illustrative methods of the present invention will now be described. In general, the methods of the present invention are directed to obtaining metrology data as to the weight and/or mass of the process layer added (for deposition processes) or removed (for etching processes), and using that information to control one or more aspects of a processing operation. The particular type of metrology instrumentation 14 used in the present invention may be varied. For example, the metrology instrumentation 14 may be one or more pressure sensors that are used to sense the pressure applied to the substrate 16 before, during or after the process layer 18 is formed above the substrate 16. That is, knowing the contact area between the pressure sensors and the substrate 16, the applied force, i.e., the weight of the material added, may be readily determined (F=PA) where F=applied force or weight, P=pressure sensed, and A=contact area between sensor and substrate. Furthermore, knowing the weight ("W") of the material applied, the area ($A_S$) of the substrate 16 covered, a known value, and the density (d) of material being applied, another known value, the thickness of the deposited layer may be determined by the following formula:

$$t = \frac{W}{dA_S}$$

In a similar manner, in the context of etching, the thickness of a portion of a layer removed or thinned may be determined. The present invention may also be used to determine the amount of material removed from a patterned process layer. That is, by knowing the area ($A_R$) of the process layer 18 to be removed during patterning operations, it can be determined how much of the process layer 18 has been removed during an etching process by the following formula:

$$t_{removed} = \frac{W}{dA_R}$$

where "W" is equal to the weight of the material removed; "$A_R$" is equal to the surface area of the process layer 18 to be removed; and "d" is equal to the density of the material.

Alternatively, the weight of the process layer removed or added may be determined through use of a scale. Moreover, the mass of the layer removed or added may be determined or measured using a balance, or other known instrumentation, or it may be determined by calculation.

As will be recognized by those skilled in the art after a complete reading of this disclosure, the present invention may be used in a variety of ways in manufacturing integrated circuit devices. In the context of a deposition application, determining the weight or mass of the material added during the deposition process may be used, for example, to endpoint the deposition process. That is, the weight or mass of the material added may be determined (directly or indirectly) and the deposition process may be stopped when the determined weight or mass is within a preselected range. In one embodiment, this may be accomplished by an in situ metrology instrumentation 14 positioned in the deposition chamber. After the substrate 16 is properly positioned on the wafer stage 12, the metrology instrumentation 14 may be "zeroed-out" such that only material added above the substrate 16 during the course of forming the process layer 18 will be sensed by the metrology instrumentation 14.

Using this technique, residual build-up on various structures within the deposition chamber, as well as variations in deposition rates of a particular process, may be ignored or compensated for, as the metrology instrumentation 14 only senses what material is placed above the substrate 16. This methodology may also be used in situations where the metrology instrumentation 14 is located in a separate metrology chamber, i.e., chamber 11C in FIG. 3, or where the metrology instrumentation 14 is contained in a stand-alone tool, as depicted in FIG. 4. In the latter situation, the substrate 16 would have to be moved from the deposition chamber to the metrology instrumentation at one or more points during the deposition process or after the process is complete. As with other methodologies, if the sensed or determined weight or mass of the material added is within a preselected range, then the substrate is allowed to proceed to additional processing stations. If it is not within the preselected acceptable limits, then the substrate 16 may be returned to the deposition chamber for additional processing.

Alternatively, or in addition to the methods described above, the determined weight or mass of the material added above the substrate 16 may be fed back to the controller 13 as an error signal when the weight or mass of the added material is not within a preselected range. In turn, the controller 13 may adjust one or more parameters of the deposition process, e.g., duration, temperature, gas flow rates, electrode gap distance, pressure, power (for PECVD processes especially), etc., that will be used in forming the process layer 18 on one or more subsequently processed substrates 16.

In the context of an etching process, the determined weight or mass of material removed during the etching process may be used, for example, to endpoint the etching process. That is, the weight or mass of the portion of the process layer 18 removed may be determined (directly or indirectly) and the etching process may be stopped when the determined weight or mass is within a preselected range or exceeds a preselected value. Alternatively, the etching process may be continued if the determined weight or mass of the removed material does not exceed a preselected value. The present invention may be used with a variety of etching processes that may be anisotropic or isotropic in nature, e.g., plasma etchers, chemical baths, etc. Moreover, the present invention may be used in the process of removing only a portion of the process layer 18, e.g., thinning the process layer 18, or patterning the process layer 18.

In other embodiments, the determined weight or mass may be used to control a rate of a process. For example, the deposition rate of a process may be slowed as the determined weight or mass approaches a desired value. Alternatively, the deposition rate may be increased if the determined weight or mass is well below a target value. Similarly, the etching rate of an etching process may be slowed as the determined weight or mass of the removed material approaches a desired value. Conversely, the etching rate may be increased until such time as the determined weight or mass of the removed material reaches a preselected value.

In one embodiment, this may be accomplished by an in situ metrology instrument 14 positioned in the etch chamber. After the substrate 16, having the process layer 18 formed thereabove, is properly positioned on the wafer stage 12, the metrology instrumentation 14 may be "zeroed-out" such that only material removed during the etching process will be sensed by the metrology instrumentation 14. Again, using this technique, residual build-up on various structures within the etch chamber, as well as variations in etching rates of a particular process, may be ignored, as the metrology instrumentation 14 only senses what material is removed from the process layer 18. This methodology may also be used in situations where the metrology instrumentation 14 is located in a separate metrology chamber within a process tool, or where the metrology instrumentation 14 is contained in a stand-alone tool, as depicted in FIG. 4. In the latter situation, the substrate 16 would have to be moved from the etch chamber to the metrology instrumentation 14 at one or more points during the etching process or after the etching process is complete. As with other methodologies, if the determined weight or mass of the material removed is within a preselected range, then the substrate 16 is allowed to proceed to additional processing stations. If it is not within the preselected acceptable limits, then the substrate 16 may be returned to the etching chamber for additional processing.

Alternatively, or in addition to the methods described above, the determined weight or mass of the material removed may be fed back to the controller 13 as an error signal when the determined weight or mass of the removed material is not within a preselected range. In turn, the controller 13 may adjust one or more parameters of the etching process, e.g., duration, temperature, power levels, gas flow rates, pressure, electrode gap distances, etc., that will be used in forming the process layer 18 on one or more subsequently processed substrates 16.

In general, the present invention is directed to methods of using weight or mass measurements or determinations to control various semiconductor manufacturing processes, and systems for accomplishing same. One illustrative method comprises providing a substrate 16, performing a deposition process to form a process layer 18 above the substrate 16, determining at least one of a weight or a mass of the process layer 18 formed above the substrate 16, and controlling at least one parameter of the deposition process based upon the determined weight or mass of the process layer 18. In further embodiments, the weight or mass may be determined by providing a pressure sensor that senses a pressure induced as a result of forming the process layer 18 above the substrate 16, and calculating the weight or mass of the process layer based upon the sensed pressure. In another embodiment, the method comprises directly measuring the weight or mass of the process layer 18 using a scale.

Another illustrative method comprises providing a substrate having a process layer 18 formed thereabove, performing an etching process to remove at least a portion of the process layer 18, determining at least one of a weight or a mass of the removed portion of the process layer 18, and controlling at least one parameter of the etching process based upon the determined weight or mass of the removed portion of the process layer. In further embodiments, the weight or mass may be determined by providing a pressure sensor that senses a change in pressure as a result of removing a portion of the process layer 18 above the substrate 16, and calculating the weight or mass of the removed portion of the process layer 18 based upon the sensed pressure. In another embodiment, the method comprises directly measuring the weight or mass of the removed portion of the process layer 18 using a scale or a balance, respectively.

One illustrative embodiment of a system in accordance with the present invention comprises a deposition tool 11 for performing a deposition process to form a process layer 18 above a substrate 16, a pressure sensor in contact, directly or indirectly, with the substrate 16 for sensing a pressure induced as a result of the process layer 18 formed above the substrate 16, and a controller 13 for controlling at least one parameter of the deposition process based upon the sensed pressure. In other illustrative embodiments, a scale, a balance, or other sensor may be substituted for the recited pressure sensor to measure the weight or mass of the material added during the process of forming the process layer 18.

Another illustrative embodiment of a system in accordance with the present invention comprises a means for performing a deposition process to form a process layer 18 above a substrate 16, a sensor means in contact, directly or indirectly, with the substrate 16 for sensing a pressure induced as a result of the process layer 18 formed above the substrate 16, and a controller means for controlling at least one parameter of the deposition process based upon the sensed pressure. In other illustrative embodiments, a scale, a balance, or other sensors may be substituted for the recited pressure sensor. In the disclosed embodiment, the means for performing the deposition process is at least one of a CVD, PVD or PECVD deposition tool, and the sensor means is a pressure sensor.

Another illustrative embodiment of a system in accordance with the present invention comprises an etch tool 21 for performing an etching process to remove at least a portion of a process layer 18 formed above a substrate 16, a pressure sensor in contact with the substrate for sensing a change in pressure resulting from the removal of at least a portion of the process layer 18, and a controller 13 for controlling at least one parameter of the etching process based upon the sensed pressure. In other illustrative embodiments, a scale, a balance, or other sensors may be used to measure the weight or mass of the material removed instead of the pressure sensor discussed above.

Another illustrative system comprises a means for performing an etching process to remove at least a portion of a process layer 18 formed above a substrate 16, a sensor means for sensing a change in pressure resulting from the removal of at least a portion of the process layer 18, and a controller means for controlling at least one parameter of the etching process based upon the sensed pressure. In other illustrative embodiments, a scale, a balance, or other sensors may be used instead of the pressure sensor discussed above. In the disclosed embodiment, the means for performing an etching process may be an etching system that performs an anisotropic or isotropic etching process, and the means for sensing a change in pressure is a pressure sensor.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It it therefore evident that the particular embodiments disclosed above may be altered or modified and all such variations are considered within the scope and spirit of the invention. Accordingly, the protection sought herein is as set forth in the claims below.

What is claimed:

1. A method, comprising:
   providing a substrate;
   performing a deposition process to form a process layer above said substrate;
   determining at least one of a weight and a mass of said process layer formed above said substrate; and
   stopping said deposition process based upon said determined weight or mass of said process layer.

2. The method of claim 1, wherein providing a substrate comprises providing a substrate comprised of silicon.

3. The method of claim 1, wherein performing a deposition process to form a process layer above said substrate comprises performing at least one of a chemical vapor deposition process, a plasma enhanced chemical vapor deposition process, a thermal growth process, and a physical vapor deposition process to form a process layer above said substrate.

4. The method of claim 1, wherein performing a deposition process to form a process layer above said substrate comprises performing a deposition process to form a process layer comprised of at least one of a metal, polysilicon, silicon dioxide and a material having a dielectric constant less than 5.0 above said substrate.

5. The method of claim 1, wherein determining at least one of a weight and a mass of said process layer formed above said substrate comprises measuring a weight or a mass of said process layer using a least one of a scale and a balance.

6. The method of claim 1, further comprising controlling at least one of a duration, a temperature, and a gas flow rate of a said deposition process upon said determined weight or a mass of said process layer.

7. The method of claim 1, further comprising performing said deposition process for an additional duration if said determined weight or mass of said process layer is not within a preselected limit.

8. The method of claim 1, further comprising adjusting at least one parameter of said deposition process based upon said determined weight or mass of said process layer and performing said deposition process comprised of said adjusted parameter on at least one subsequently processed substrate.

9. The method of claim 1, wherein determining at least one of a weight and a mass of said process layer formed above said substrate comprises:
   providing a pressure sensor that senses a pressure induced as a result of forming said process layer above said substrate; and
   calculating said weight or mass of said process layer based upon said sensed pressure.

10. The method of claim 9, wherein providing a pressure sensor comprises providing a pressure sensor in contact with said substrate.

11. The method of claim 9, wherein calculating said weight or mass of said process layer based upon said sensed pressure comprises calculating said weight of said process layer by multiplying said sensed pressure and an area of said substrate covered by said process layer together.

12. A method, comprising:
    providing a substrate;
    performing a deposition process to form a process layer above said substrate;
    providing a pressure sensor that senses a pressure induced as a result of forming said process layer above said substrate;
    calculating a weight of said process layer based upon said sensed pressure; and
    stopping said deposition process based upon said calculated weight of said process layer.

13. The method of claim 12, wherein providing a substrate comprises providing a substrate comprised of silicon.

14. The method of claim 12, wherein performing a deposition process to form a process layer above said substrate comprises performing at least one of a chemical vapor deposition process, a plasma enhanced chemical vapor deposition process, a thermal growth process, and a physical vapor deposition process to form a process layer above said substrate.

15. The method of claim 12, wherein performing a deposition process to form a process layer above said substrate comprises performing a deposition process to form a process layer comprised of at least one of a metal, polysilicon, silicon dioxide and a material having a dielectric constant less than 5.0 above said substrate.

16. The method of claim 12, wherein calculating a weight of said process layer based upon said sensed pressure comprises calculating a weight of said process layer by multiplying said sensed pressure and an area of said substrate covered by said process layer together.

17. The method of claim 12, further comprising controlling at least one of a duration, a temperature, and a gas flow rate of said deposition process based upon said calculated weight of said process layer.

18. The method of claim 12, further comprising performing said deposition process for an additional duration if said calculated weight of said process layer is not within a preselected limit.

19. The method of claim 12, further comprising adjusting at least one parameter of said deposition process based upon said calculated weight of said process layer and performing said deposition process comprised of said adjusted parameter on at least one subsequently processed substrate.

20. A method, comprising:
    providing a substrate;
    performing a deposition process to form a process layer above said substrate;
    measuring a mass of said process layer formed above said substrate; and
    stopping said deposition process based upon said measured mass of said process layer.

21. The method of claim 20, wherein providing a substrate comprises providing a substrate comprised of silicon.

22. The method of claim 20, wherein performing a deposition process to form a process layer above said substrate comprises performing at least one of a chemical vapor deposition process, a plasma enhanced chemical vapor deposition process, a thermal growth process, and a physical vapor deposition process to form a process layer above said substrate.

23. The method of claim 20, wherein performing a deposition process to form a process layer above said substrate comprises performing a deposition process to form a process layer comprised of at least one of a metal, polysilicon, silicon dioxide and a material having a dielectric constant less than 5.0 above said substrate.

24. The method of claim 20, wherein measuring a mass of said process layer formed above said substrate comprises measuring a mass of said process layer using a balance.

25. The method of claim 20, further comprising controlling at least one of a duration, a temperature, and a gas flow rate of said deposition process based upon said measured mass of said process layer.

26. The method of claim 20, further comprising performing said deposition process for an additional duration if said measured mass of said process layer is not within a preselected limit.

27. The method of claim 20, further comprising adjusting at least one parameter of said deposition process based upon said measured mass of said process layer and performing said deposition process comprised of said adjusted parameter on at least one subsequently processed substrate.

28. A method, comprising:
providing a substrate having a process layer formed thereabove;
performing an etching process to remove at least a portion of said process layer;
determining at least one of a weight and a mass of said removed portion of said process layer; and
controlling at least one parameter of said etching process based upon said determined weight or mass of said removed portion of said process layer.

29. The method of claim 28, wherein providing a substrate having a process layer formed thereabove comprises providing a substrate comprised of silicon having a process layer formed thereabove.

30. The method of claim 28, wherein providing a substrate having a process layer formed thereabove comprises providing a substrate having a process layer comprised of at least one of a metal, polysilicon, silicon dioxide and a material having a dielectric constant less than 5.0 formed thereabove.

31. The method of claim 28, wherein performing an etching process to remove at least a portion of said process layer comprises performing at least one of an anisotropic etching process and an isotropic etching process to remove at least a portion of said process layer.

32. The method of claim 28, wherein performing an etching process to remove at least a portion of said process layer comprises performing an etching process to reduce a thickness of said process layer.

33. The method of claim 28, wherein performing an etching process to remove at least a portion of said process layer comprises performing an etching process to pattern said process layer.

34. The method of claim 28, wherein determining at least one of a weight and a mass of said removed portion of said process layer comprises measuring a weight or a mass of said removed portion of said process layer.

35. The method of claim 28, wherein controlling at least one parameter of said etching process based upon said determined weight of said removed portion of said process layer comprises stopping said etching process based upon said determined weight or mass of said removed portion of said process layer.

36. The method of claim 28, wherein controlling at least one parameter of said etching process based upon said determined weight or mass of said removed portion of said process layer comprises controlling at least one of a duration, a temperature, a power level and gas flow rate of said etching process based upon said determined weight or mass of said removed portion of said process layer.

37. The method of claim 28, further comprising performing additional etching operations on said process layer if said determined weight or mass of said removed portion of said process layer does not exceed a preselected value.

38. The method of claim 28, further comprising adjusting at least one parameter of said etching process based upon said determined weight or mass of said removed portion and performing said etching process comprised of said adjusted parameter on at least one subsequently process substrate.

39. The method of claim 28, wherein determining at least one of a weight and a mass of said remove portion of said process layer comprises:
providing a pressure sensor that senses a change in pressure as a result of removing said portion of said substrate; and
calculating said weight or said mass of said removed portion of said process layer based upon said sensed change in pressure.

40. The method of claim 39, wherein providing a pressure sensor comprises providing a pressure sensor in contact with said substrate.

41. The method of claim 39, wherein calculating said weight or said mass of said removed portion of said process layer based upon said sensed change in pressure comprises calculating said weight of said removed portion of said process layer by multiplying said sensed change in pressure and a surface area of said removed portion of said substrate.

42. A method, comprising:
providing a substrate having a process layer formed thereabove;
performing an etching process to remove at least a portion of said process layer;
providing a pressure sensor that senses a change in pressure as a result of removing said portion of said substrate;
determining at least one of a weight and a mass of said removed portion of said process layer based upon said sensed change in pressure; and
controlling at least one parameter of said etching process based upon said determined weight or mass of said removed portion of said process layer.

43. The method of claim 42, wherein providing a substrate having a process layer formed thereabove comprises providing a substrate comprised of silicon having a process layer formed thereabove.

44. The method of claim 42, wherein providing a substrate having a process layer formed thereabove comprises providing a substrate having a process layer comprised of at least one of a metal, polysilicon, silicon dioxide and a material having a dielectric constant less than 5.0 formed thereabove.

45. The method of claim 42, wherein performing an etching process to remove at least a portion of said process layer comprises performing at least one of an anisotropic etching process and an isotropic etching process to remove at least a portion of said process layer.

46. The method of claim 42, wherein performing an etching process to remove at least a portion of said process layer comprises performing an etching process to reduce a thickness of said process layer.

47. The method of claim 42, wherein performing an etching process to remove at least a portion of said process layer comprises performing an etching process to pattern said process layer.

48. The method of claim 42, wherein providing a pressure sensor comprises providing a pressure sensor in contact with said substrate.

49. The method of claim 42, wherein determining at least one of a weight and a mass of said removed portion of said process layer based upon said sensed change in pressure comprises calculating a weight of said removed portion of said process layer by multiplying said sensed change in pressure and a surface area of said removed portion of said substrate.

50. The method of claim 42, wherein controlling at least one parameter of said etching process based upon said determined weight or mass of said removed portion of said process layer comprises stopping said etching process based upon said determined weight or mass of said removed portion of said process layer.

51. The method of claim 42, wherein controlling at least one parameter of said etching process based upon said determined weight or mass of said removed portion of said process layer comprises controlling at least one of a duration, a temperature, a power level and gas flow rate of said etching process based upon said determined weight or mass of said removed portion of said process layer.

52. The method of claim 42, further comprising performing additional etching operations on said process layer if said determined weight or mass of said removed portion of said process layer does not exceed a preselected value.

53. The method of claim 42, further comprising adjusting at least one parameter of said etching process based upon said determined weight or mass of said removed portion and performing said etching process comprised of said adjusted parameter on at least one subsequently process substrate.

54. A method, comprising:
providing a substrate having a process layer formed thereabove;
performing an etching process to remove at least a portion of said process layer;
measuring at least one of a weight and a mass of said removed portion of said process layer; and
controlling at least one parameter of said etching process based upon said measured weight or mass of said removed portion of said process layer.

55. The method of claim 54, wherein providing a substrate having a process layer formed thereabove comprises providing a substrate comprised of silicon having a process layer formed thereabove.

56. The method of claim 53, wherein providing a substrate having a process layer formed thereabove comprises providing a substrate having a process layer comprised of at least one of a metal, polysilicon, silicon dioxide and a material having a dielectric constant less than 5.0 formed thereabove.

57. The method of claim 54, wherein performing an etching process to remove at least a portion of said process layer comprises performing at least one of an anisotropic etching process and an isotropic etching process to remove at least a portion of said process layer.

58. The method of claim 54, wherein performing an etching process to remove at least a portion of said process layer comprises performing an etching process to reduce a thickness of said process layer.

59. The method of claim 54, wherein performing an etching process to remove at least a portion of said process layer comprises performing an etching process to pattern said process layer.

60. The method of claim 54, wherein measuring at least one of a weight and a mass of said removed portion of said process layer comprises measuring a weight or a mass of said removed portion of said process layer using at least one of a scale and a balance.

61. The method of claim 54, wherein controlling at least one parameter of said etching process based upon said measured weight or mass of said removed portion of said process layer comprises stopping said etching process based upon said measured weight or mass of said removed portion of said process layer.

62. The method of claim 54, wherein controlling at least one parameter of said etching process based upon said measured weight or mass of said removed portion of said process layer comprises controlling at least one of a duration, a temperature, a power level and gas flow rate of said etching process based upon said measured weight or mass of said removed portion of said process layer.

63. The method of claim 54, further comprising performing additional etching operations on said process layer if said measured weight or mass of said removed portion of said process layer does not exceed a preselected value.

64. The method of claim 54, further comprising adjusting at least one parameter of said etching process based upon said measured weight or mass of said removed portion and performing said etching process comprised of said adjusted parameter on at least one subsequently process substrate.

65. A method, comprising:
providing a substrate;
performing a deposition process to form a process layer above said substrate;
providing a pressure sensor in contact with said substrate that senses a pressure induced as a result of forming said process layer above said substrate;
calculating a weight of said process layer based upon said sensed pressure; and
controlling at least one parameter of said deposition process based upon said calculated weight of said process layer.

66. A method, comprising:
providing a substrate;
performing a deposition process to form a process layer above said substrate;
determining at least one of a weight and a mass of said process layer formed above said substrate; and
controlling at least one of a duration, a temperature, and a gas flow rate of said deposition process based upon said determined weight or mass of said process layer.

67. The method of claim 66, further comprising stopping said deposition process based upon said determined weight or mass of said process layer.

68. The method of claim 66, further comprising performing said deposition process for an additional duration if said determined weight or mass of said process layer is not within a preselected limit.

69. The method of claim 66, further comprising adjusting at least one parameter of said deposition process based upon said determined weight or mass of said process layer and performing said deposition process comprised of said adjusted parameter on at least one subsequently processed substrate.

70. The method of claim 66, wherein determining at least one of a weight and a mass of said process layer formed above said substrate comprises:
providing a pressure sensor that senses a pressure induced as a result of forming said process layer above said substrate; and
calculating said weight or mass of said process layer based upon said sensed pressure.

71. The method of claim 70, wherein providing a pressure sensor comprises providing a pressure sensor in contact with said substrate.

72. A method, comprising:
providing a substrate;
performing a deposition process to form a process layer above said substrate;
determining at least one of a weight and a mass of said process layer formed above said substrate;
controlling at least one parameter of said deposition process based upon said determined weight or mass of said process layer; and
performing said deposition process for an additional duration if said determined weight or mass of said process layer is not within a preselected limit.

73. The method of claims 72, wherein determining at least one of a weight and a mass of said process layer formed above said substrate comprises:
providing a pressure sensor that senses a pressure induced as a result of forming said process layer above said substrate; and
calculating said weight or mass of said process layer based upon said sensed pressure.

74. The method of claim 73, wherein providing a pressure sensor comprises providing a pressure sensor in contact with said substrate.

75. The method of claim 72, wherein controlling at least one parameter of said deposition process based upon said determined weight or mass of said process layer comprises stopping said deposition process based upon said determined weight or mass of said process layer.

76. The method of claim 72, wherein controlling at least one parameter of said deposition process based upon said determined weight or mass of said process layer comprises controlling at least one of a duration, a temperature, and a gas flow rate of said deposition process based upon said determined weight or mass of said process layer.

77. The method of claim 72, further comprising adjusting at least one parameter of said deposition process based upon said determined weight or mass of said process layer and performing said deposition process comprised of said adjusted parameter on at least one subsequently processed substrate.

78. A method, comprising:
providing a substrate;
performing a deposition process to form a process layer above said substrate;
measuring a mass of said process layer formed above said substrate; and
controlling at least one of a duration, a temperature, and a gas flow rate of said deposition process based upon said measured mass of said process layer.

79. The method of claim 78, further comprising stopping said deposition process based upon said measured mass of said process layer.

80. The method of claim 78, further comprising performing said deposition process for an additional duration if said measured mass of said process layer and preselected limit.

81. The method of claim 78, further comprising adjusting at least one parameter of said deposition process based upon said measured mass of said process layer and performing said deposition process comprised of said adjusted parameter on at least one subsequently processed substrate.

82. A method, comprising:
providing a substrate;
performing a deposition process to form a process layer above said substrate;
measuring a mass of said process layer formed above said substrate;
controlling at least one parameter of said deposition process based upon said measured mass of said process layer; and
performing said deposition process for an additional duration if said measured mass of said process layer is not within a preselected limit.

83. The method of claim 82, wherein controlling at least one parameter of said deposition process based upon said measured mass of said process layer comprises stopping said deposition process based upon said measured mass of said process layer.

84. The method of claim 82, wherein controlling at least one parameter of said deposition process based upon said measured mass of said process layer comprises controlling at least one of a duration, a temperature, and a gas flow rate of said deposition process based upon said measured mass of said process layer.

85. The method of claim 82, further comprising adjusting at least one parameter of said deposition process based upon said measured mass of said process layer and performing said deposition process comprised of said adjusted parameter on at least one subsequently processed substrate.

86. A method, comprising:
providing a substrate;
performing a deposition process to form a process layer above said substrate;
providing a pressure sensor that senses a pressure induced as a result of forming said process layer above said substrate;
calculating a weight of said process layer based upon said sensed pressure; and
controlling at least one of a duration, a temperature, and a gas flow rate of said deposition process based upon said calculated weight of said process layer.

87. The method of claim 86, wherein calculating a weight of said process layer based upon said sensed pressure comprises calculating a weight of said process layer by multiplying said sensed pressure and an area of said substrate covered by said process layer together.

88. The method of claim 86, further comprising stopping said deposition process based upon said calculated weight of said process layer.

89. The method of claim 86, further comprising performing said deposition process for an additional duration if said calculated weight of said process layer is not within a preselected limit.

90. The method of claim 86, further comprising adjusting at least one parameter of said deposition process based upon said calculated weight of said process layer and performing said deposition process comprised of said adjusted parameter on at least one subsequently processed substrate.

91. A method, comprising:

providing a substrate;

performing a deposition process to form a process layer above said substrate;

providing a pressure sensor that senses a pressure induced as a result of forming said process layer above said substrate;

calculating a weight of said process layer based upon said sensed pressure;

controlling at least one parameter of said deposition process based upon said calculated weight of said process layer; and performing said deposition process for an additional duration if said calculated weight of said process layer is not within a preselected limit.

92. The method of claim 91, wherein calculating a weight of said process layer based upon said sensed pressure comprises calculating a weight of said process layer by multiplying said sensed pressure and an area of said substrate covered by said process layer together.

93. The method of claim 91, wherein controlling at least one parameter of said deposition process based upon said calculated weight of said process layer comprises stopping said deposition process based upon said calculated weight of said process layer.

94. The method of claim 91, wherein controlling at least one parameter of said deposition process based upon said calculated weight of said process layer comprises controlling at least one of a duration, a temperature, and a gas flow rate of said deposition process based upon said calculated weight of said process layer.

95. The method of claim 91, further comprising adjusting at least one parameter of said deposition process based upon said calculated weight of said process layer and performing said deposition process comprised of said adjusted parameter on at least one subsequently processed substrate.

* * * * *

UNITED STATES PATENT AND TRADEMARK OFFICE
CERTIFICATE OF CORRECTION

PATENT NO. : 6,790,376 B1
DATED : September 14, 2004
INVENTOR(S) : Richard J. Markle and Robert J. Chong It is certified that error appears in the above-identified patent and that said Letters Patent is hereby corrected as shown below:

Column 11,
Line 49, "using a" should be -- using at --.
Line 53, after "of" delete "a".
Line 53, after "process" insert -- based --.
Line 54, before "mass" delete "a".

Column 15,
Line 57, "53" should be -- 54 --.

Column 17,
Line 27, "claims" should be -- claim --.

Column 18,
Line 3, "and" should be -- is not within a --.

Signed and Sealed this

Eighteenth Day of January, 2005

JON W. DUDAS
*Director of the United States Patent and Trademark Office*